(12) United States Patent
Sotnikow et al.

(10) Patent No.: US 7,956,490 B2
(45) Date of Patent: Jun. 7, 2011

(54) BATTERY BACKUP FOR VEHICLE EMERGENCY COMMUNICATOR

(76) Inventors: Jack Sotnikow, Plainview, NJ (US); Milton Bodin, Teaneck, NJ (US)

(*) Notice: Subject to any disclaimer, the term of this patent is extended or adjusted under 35 U.S.C. 154(b) by 0 days.

(21) Appl. No.: 12/801,600

(22) Filed: Jun. 16, 2010

(65) Prior Publication Data
US 2011/0062777 A1    Mar. 17, 2011

Related U.S. Application Data

(60) Provisional application No. 61/272,355, filed on Sep. 16, 2009.

(51) Int. Cl.
*B60L 1/00* (2006.01)
*B60L 3/00* (2006.01)
*H02G 3/00* (2006.01)

(52) U.S. Cl. ...................................... 307/10.1

(58) Field of Classification Search ............... 307/10.1, 307/64, 66; 340/425.5, 500
See application file for complete search history.

(56) References Cited

U.S. PATENT DOCUMENTS

| | | | |
|---|---|---|---|
| 5,191,500 A | 3/1993 | Hatano et al. | |
| 5,432,385 A | 7/1995 | Kincaid et al. | |
| 5,487,956 A | 1/1996 | Bromley et al. | |
| 5,995,891 A | 11/1999 | Mayumi et al. | |
| 6,591,176 B1 | 7/2003 | Perry et al. | |
| 6,980,092 B2 | 12/2005 | Turnbull et al. | |
| 7,170,193 B2 | 1/2007 | Ferre | |
| 7,260,457 B2 | 8/2007 | Ma et al. | |
| 7,545,121 B2 * | 6/2009 | Bolduc | .................. 320/163 |
| 2002/0173881 A1 | 11/2002 | Lash et al. | |
| 2008/0103655 A1 | 5/2008 | Turnbull et al. | |

OTHER PUBLICATIONS

On star will get battery backup, two pages printed from the internet Mar. 11, 2009 http://goliath.ecnext.com/coms2/gi_0199-4497673/OnStar-will-get-battery-backup.html.

* cited by examiner

*Primary Examiner* — Jared J Fureman
*Assistant Examiner* — Carlos Amaya
(74) *Attorney, Agent, or Firm* — Richard C. Litman (57) ABSTRACT

The battery backup for vehicle emergency communicator includes mechanisms for applying backup battery power to an emergency communicator. Electrically operated relays may be employed to switch the backup battery in order to power the emergency communicator of a telematics device. When relays are used in the system, failure of the car battery causes normally open relay contacts to close, applying backup battery power to the emergency communications device. Normally closed relay contacts open to remove connection of the failed battery to the emergency communications device. Additional features of the battery backup for vehicle emergency communicator may include a battery charger, an uninterruptible power system (UPS), transistor switches, an emergency contact dialer, and a timer that limits application time of the backup battery.

9 Claims, 8 Drawing Sheets

BATTERY BACKUP FOR VEHICLE EMERGENCY COMMUNICATOR

CROSS-REFERENCE TO RELATED APPLICATION

This application claims the benefit of U.S. Provisional Patent Application Ser. No. 61/272,355, filed Sep. 16, 2009.

BACKGROUND OF THE INVENTION

1. Field of the Invention

The present invention relates generally to battery backup systems, and particularly to a battery backup for a vehicle emergency communicator that provides a backup battery system for telematics devices to assure that emergency communications between the vehicle and a dispatcher can be established notwithstanding vehicle battery failure.

2. Description of the Related Art

In the market today there exists a variety of vehicle installed emergency communication systems, some having GPS, designed to provide not only information as to location, directions and provide various important information such as nearest hospital, restaurant, garage, auto dealer, hotel etc. but also to track the vehicle if stolen or open the door from outside if keys are unavailable & person is locked out.

There is also automatic or manual emergency communications if the car is in an accident, is disabled or is flooded out, and the driver needs help. These on-board emergency communication systems are capable of automatically dialing police and other first responder assistance if the vehicle occupant is in an accident and, e.g., the air bags inflate.

A major problem with an on-board emergency communication system is that if the car battery power fails there is no assurance that the on-board emergency communicator will work unless it is connected to a backup power source.

While on-board emergency communication systems are intended to be used for emergencies, a system without a battery backup is vulnerable to fail if the car battery is somehow de-activated.

Thus a battery backup for vehicle emergency communicator solving the aforementioned problems is desired.

SUMMARY OF THE INVENTION

The battery backup for vehicle emergency communicator includes mechanisms for applying backup battery power to an emergency communicator. Electrically operated relays may be employed to switch the backup battery in order to power the emergency communicator of a telematics device. When relays are used in the system, failure of the car battery causes normally open relay contacts to close, applying backup battery power to the emergency communications device. Normally closed relay contacts open to remove connection of the failed battery to the emergency communications device.

Additional features of the battery backup for vehicle emergency communicator may include a battery charger, an uninterruptible power system (UPS), transistor switches, an emergency contact dialer, and a timer that limits application time of the backup battery.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

As shown in FIGS. 1-7, the battery backup for vehicle emergency communicator includes mechanisms for applying backup battery power to an emergency communicator, such as an OnStar® (OnStar is a registered trademark owned by OnStar, LLC of Detroit, Mich.). As shown in FIGS. 4-7, a typical telematics emergency communicator includes an activation pushbutton PB and a microphone OM. And, as most clearly shown in FIG. 7, electrically operated relays 701a, 702a may be employed to switch the backup battery 30b in order to power the emergency communicator of the telematics device by electrically activating the pushbutton PB. When the relays 701a and 702a are used in the system, failure of the car battery 11 causes normally open relay contacts of 701a to close, thereby applying backup battery power to the emergency communications device, and normally open relay contacts of 702a to close, thereby activating communicator pushbutton PB and system dialer 502. After a preset, relay 702a is activated locking out relay 701a, deactivating emergency communicator and pushbutton PB.

Additional features of the battery backup for vehicle emergency communicator may include a separate battery and charger 15, an uninterruptible battery power supply (UPS) 30a, transistor switches Q1, Q2, Q3 (transistors Q1, Q2, and Q3 may be conventional npn bipolar switching transistors), an emergency contact dialer 502, and a timer 555 that limits application time of the backup battery 30b.

Figure 1:
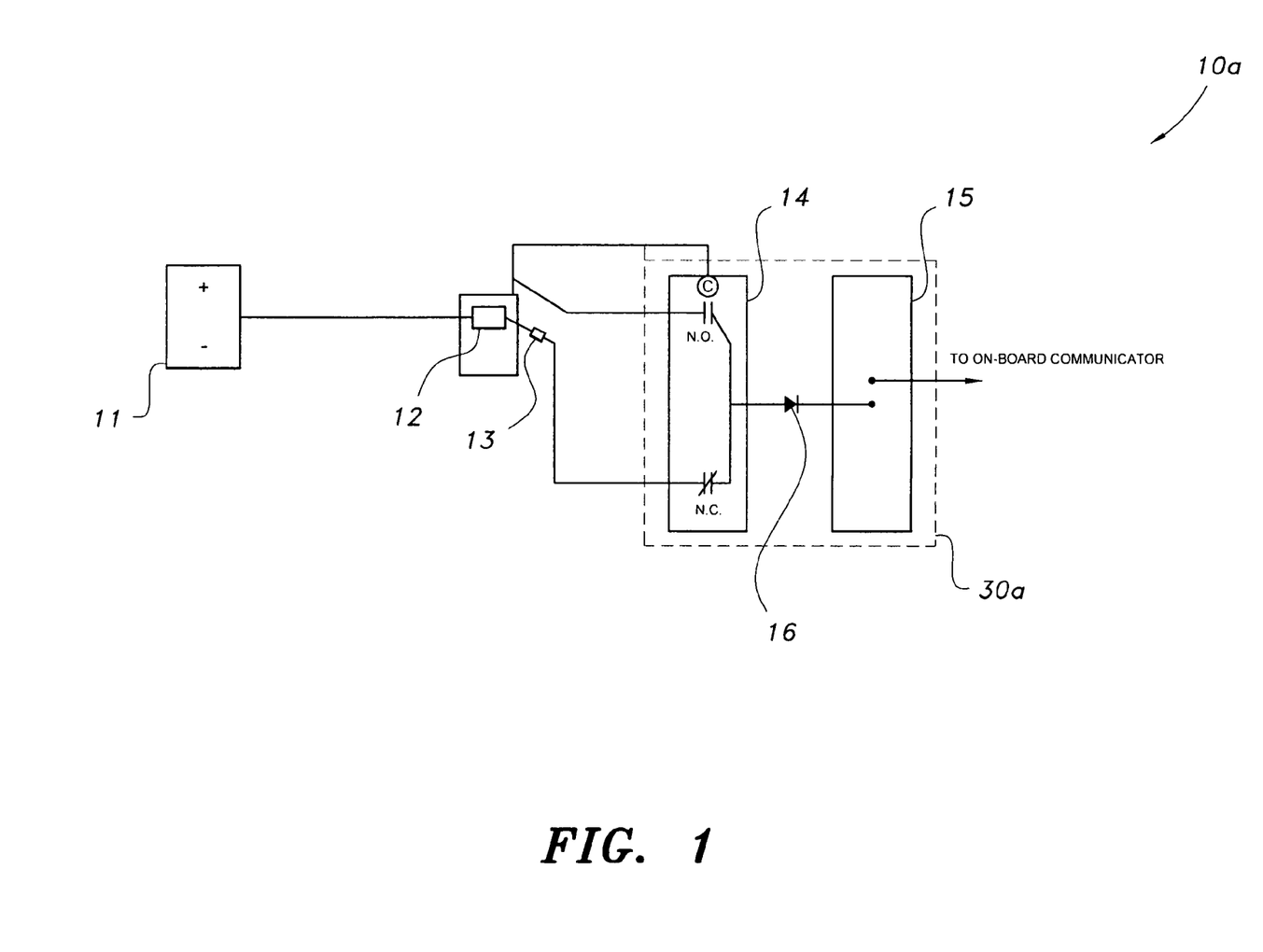
FIG. 1 is a block diagram of a battery backup for vehicle emergency communicator according to the present invention, featuring the use of one relay, a diode for switching, and a battery charger.

As most clearly shown in FIG. 1, emergency power system 10a includes a small, compact, inexpensive uninterruptible battery power source 30a that provides a separate charger and battery 15, and electrically operated relay 14 for power switching when the car battery 11 goes dead. A 30-amp fuse 12 for the sound system of the emergency communicator is provided. A 5-amp fuse 13 protects the relay 14 of the emergency power system 10a. A protective diode 16 connects from the contacts of relay 14 to the battery charger, battery and light to indicate charge 15, which has a connection to on-board emergency communicator.

Figure 2:
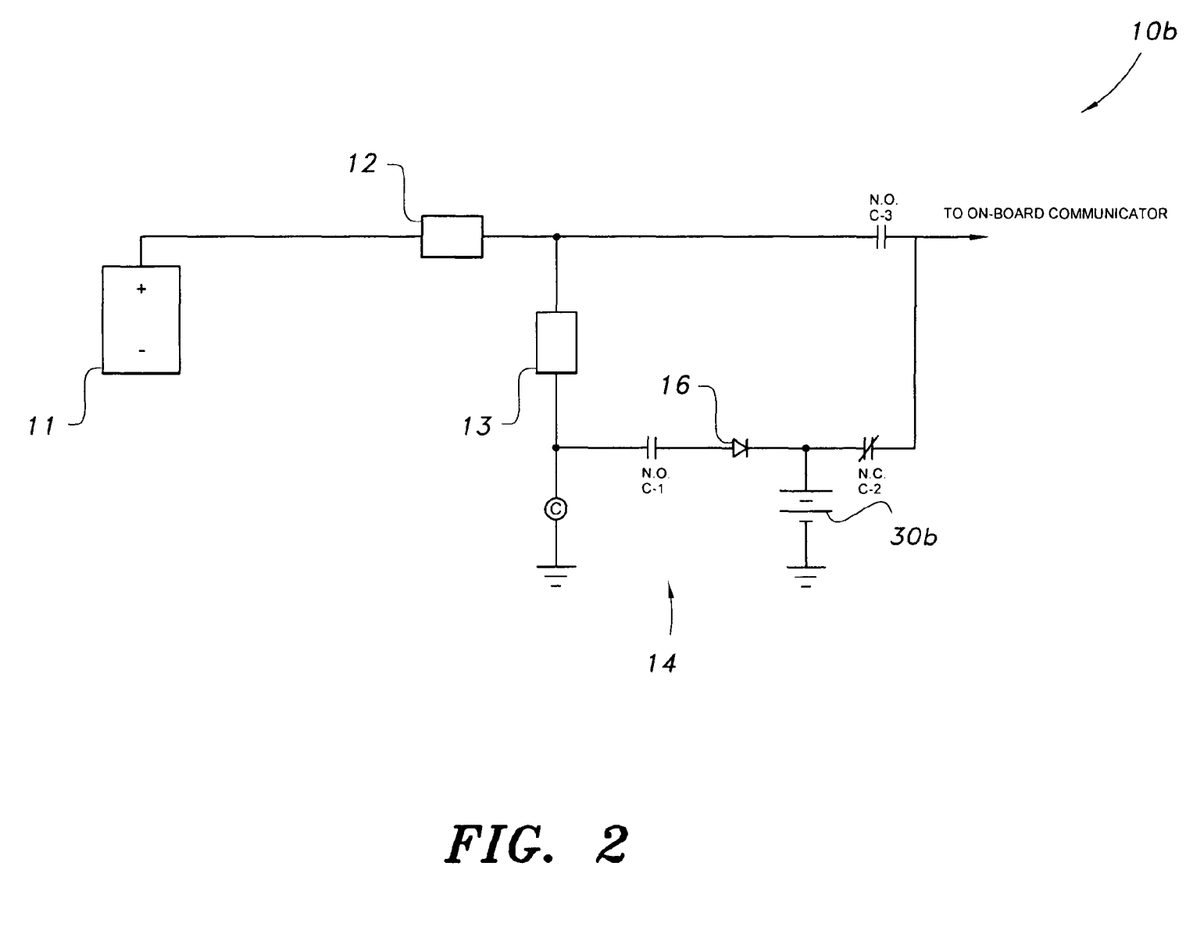
FIG. 2 is a block diagram of a battery backup for vehicle emergency communicator according to the present invention, featuring the use of one relay, and a diode for switching.

As most clearly shown in FIG. 2, emergency power system 10b includes a backup battery 30b that is cut-in to the emergency communicator based on the state of relay 14. The main battery 11 is connected to the normally open contacts C-1 of relay 14 via 30-amp fuse 12. A 5-amp fuse 13 provides protection to the coil C of relay 14 (a triple-pole, single-throw relay with normally open contacts C-1 and C3, and normally closed contacts C-2) while it is energized by a properly functioning main battery 11. Backup battery 30b is connected to the normally closed contacts C-2 of relay 14. Diode 16 is connected between normally open contacts C-1 and normally closed contacts C-2.

When the main battery 11 is functional, the relay 14 is energized, closing contacts C-1 and charging backup battery 30b through diode 16. At this point in time, contacts C-2 are open, and normally open contacts C-3 are closed, thereby supplying power to the on-board emergency communicator from main battery 11. When the main battery fails, contacts C-3 open and contacts C-2 close, thereby supplying power to the on-board emergency communicator from the backup battery 30b. Diode 16 has a 0.3-volt to 0.6-volt drop, so back up battery 30b is a few tenths of a volt less than the main battery 11, thereby providing isolation. Contacts C-3 prevent shorting of the backup battery 30b if the main battery 11 or its feed gets grounded.

Figure 3:
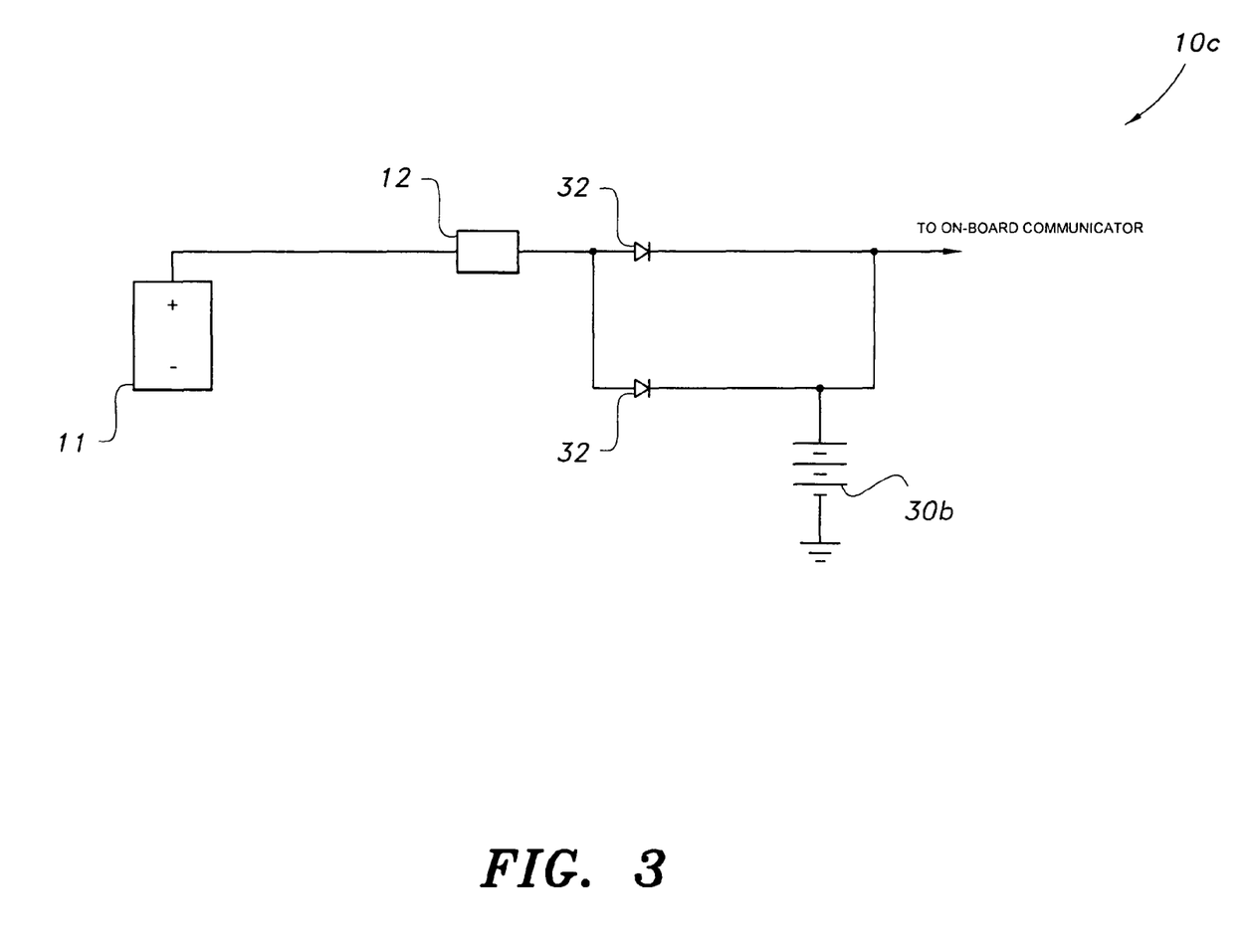
FIG. 3 is a block diagram of a battery backup for vehicle emergency communicator according to the present invention, featuring a pair of diodes for switching.

As most clearly shown in FIG. 3, emergency power system 10c includes a backup battery 30b that is always in the circuit to the emergency communicator and charged by diodes 32 as long as the main battery 11 is operational. The circuit is protected by 30-amp fuse 12. Voltage to the on-board emergency communicator is reduced by 0.3 to 0.6 volts, due to diodes 32. Diodes 32 provide isolation if the voltage of the main battery 11 drops below 12 volts or if its feed is shorted or open.

Figure 4:
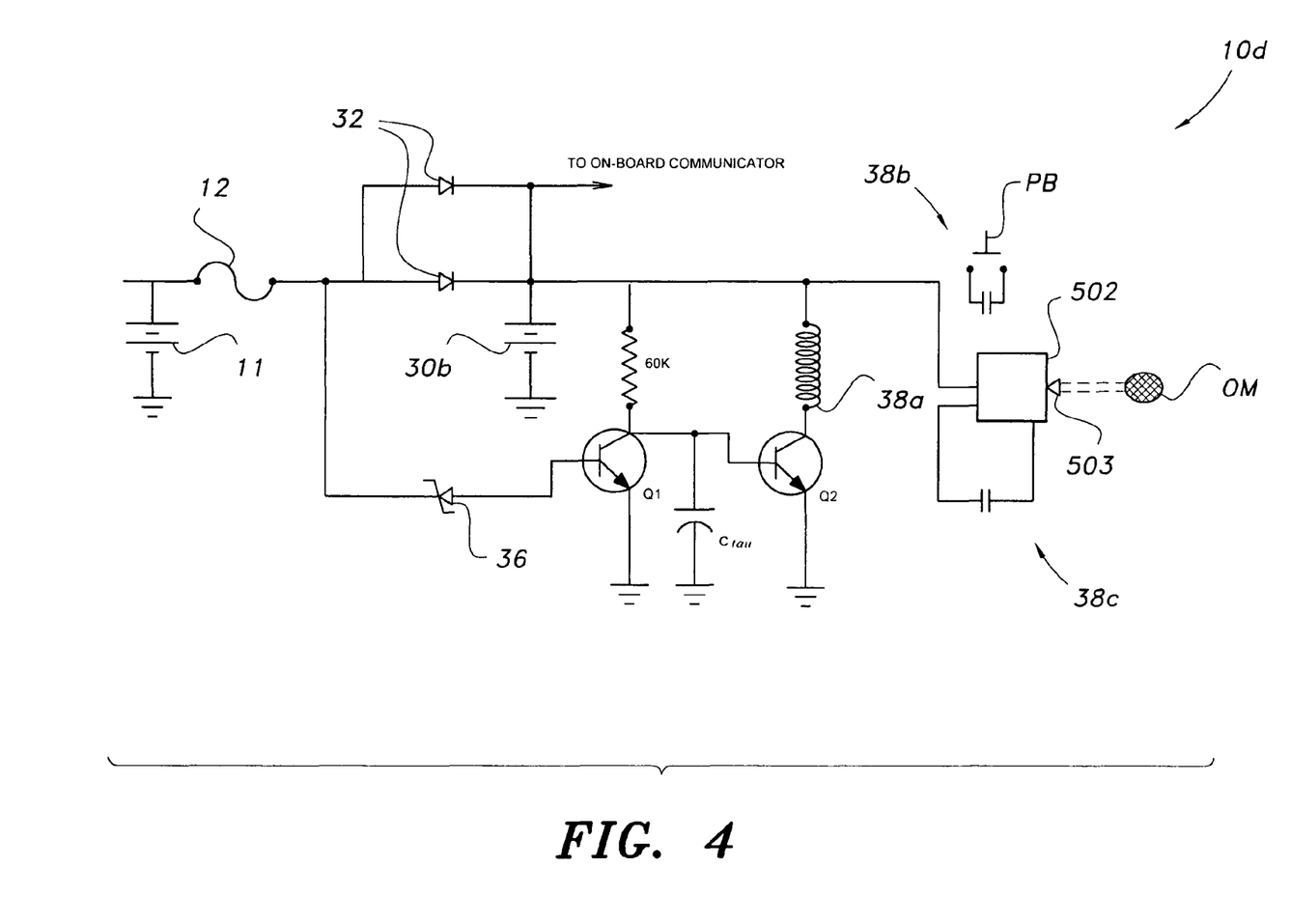
FIG. 4 is a block diagram of a battery backup for vehicle emergency communicator according to the present invention, featuring a pair of diodes and a pair of transistors for switching, and a relay for telematics and dialer activation.

As most clearly shown in FIG. 4, emergency power system 10d includes a backup battery 30b and a tape recorder 502 for recording DTMF tones and a voice message to accomplish automated dialing using the on-board emergency communicator. Connection to the main battery 11 is protected by fuse 12. Isolation of backup battery 30b is provided by diodes 32.

When the main battery 11 is fully functional at a nominal 12 volts, the zener diode 36 conducts current to place approximately between 1 and 2 volts on the base of transistor Q1, which de-energizes relay coil 38a (the coil of a double-pole, single-throw relay having normally open contacts 38b and 38c) so that relay contacts 38b and 38c remain open, thereby not activating the emergency communicator pushbutton PB nor the tape recorder/emergency dialer 502.

When the main battery 11 is no longer functional, i.e., below the nominal 12 volts, no voltage will pass through zener diode 36. Therefore, the collector of transistor Q1 will go high, thereby causing transistor Q2 to conduct to energize relay coil 38a. The normally open contacts 38b close, shorting the contacts of push button PB, thereby keying the vehicle emergency communicator pushbutton PB. The normally open contacts 38c also close, shorting the contacts of the play button of the tape recorder 502, thereby activating the tape recorder 502, which plays a pre-recorded DTMF sequence and a prerecorded voice message dialing the emergency dispatcher and notifying the dispatcher of the emergency, respectively, through the speaker 503, which is in close proximity to the emergency communicator microphone OM. Moreover, the tape recorder 502 could be configured to dial whomever the user desires to have dialed, e.g., a family member, friend, etc.

Figure 5:
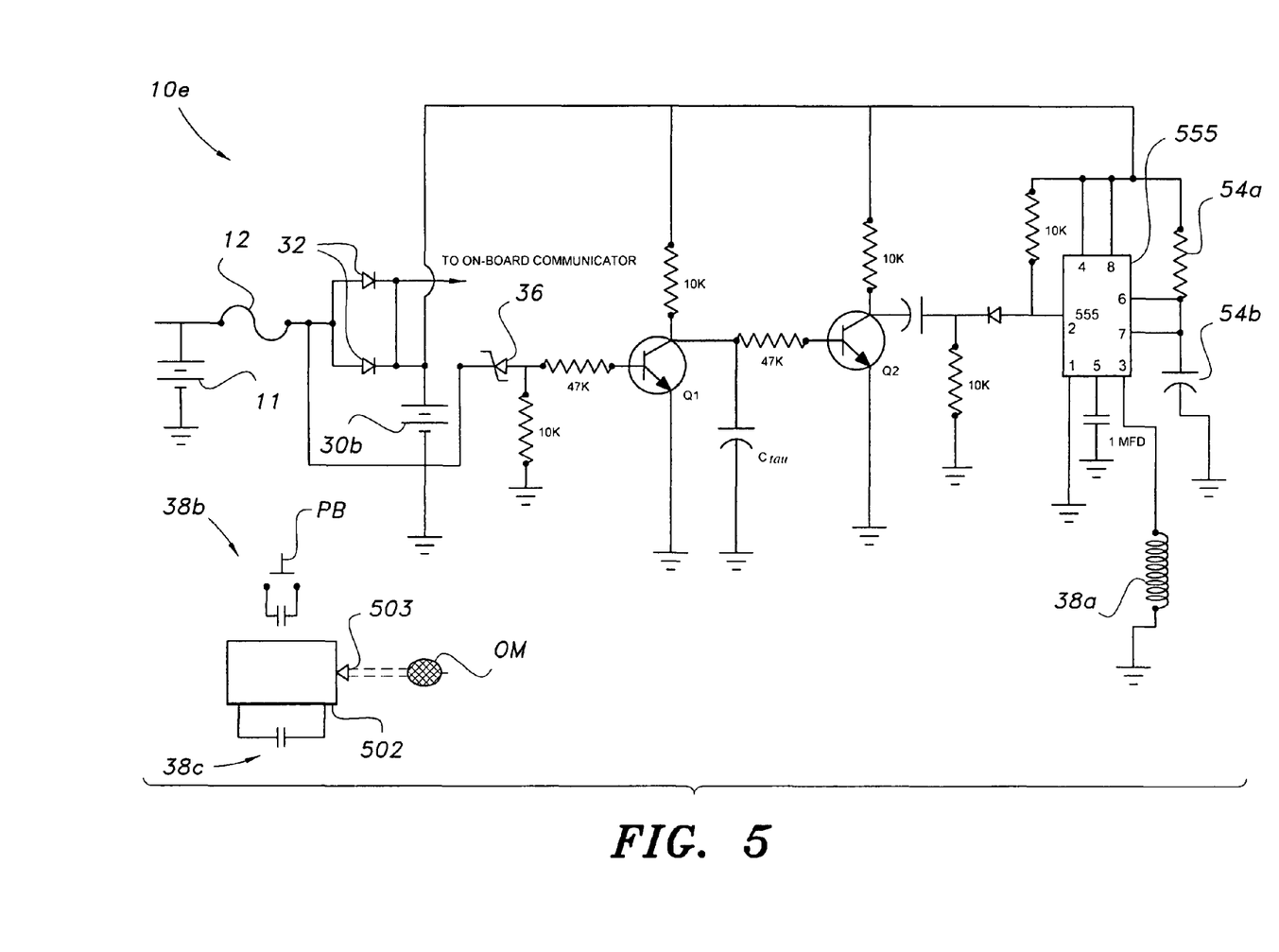
FIG. 5 is a block diagram of a battery backup for vehicle emergency communicator according to the present invention, featuring a pair of diodes and a pair of transistors for switching, a zener diode for voltage regulation, and an integrated solid-state timer for telematics and dialer activation.

As most clearly shown in FIG. 5, emergency power system 10e includes a backup battery 30b and a tape recorder 502 for recording DTMF tones and a voice message to accomplish automated dialing and dispatcher notification using the on-board emergency communicator. Connection to the main battery 11 is protected by fuse 12. When the main battery 11 is fully functional at a nominal 12 volts, the zener diode 36 conducts current to place approximately between 1 and 2 volts on base of transistor Q1 that keeps transistor Q2 from triggering the integrated circuit 555 timer 555.

When the main battery 11 is no longer functional, i.e., below the nominal 12 volts, no voltage will pass through zener diode 36. Therefore, the collector of transistor Q1 will go high, thereby causing transistor Q2 to conduct, causing the collector of transistor Q2 to drop, initiating a negative pulse to trigger IC timer 555, which turns on the relay coil 38a for a time of approximately 20 seconds, as determined by resistor 54a and capacitor 54b, e.g., if resistor 54a is 100K ohms and capacitor 54b is 200 mfd, then the energizing time will be approximately 20 seconds). The normally open contacts 38b close, shorting the contacts of pushbutton PB, thereby keying the vehicle emergency communicator pushbutton PB. The normally open contacts 38c also close, shorting the play button of the tape recorder 502, thereby activating the tape recorder 502, which plays a pre-recorded DTMF sequence dialing the emergency dispatcher through the speaker 503, which is in close proximity to the emergency communicator microphone OM, to effect dialing of the emergency communicator and complete the call to the emergency dispatcher.

Figure 6:
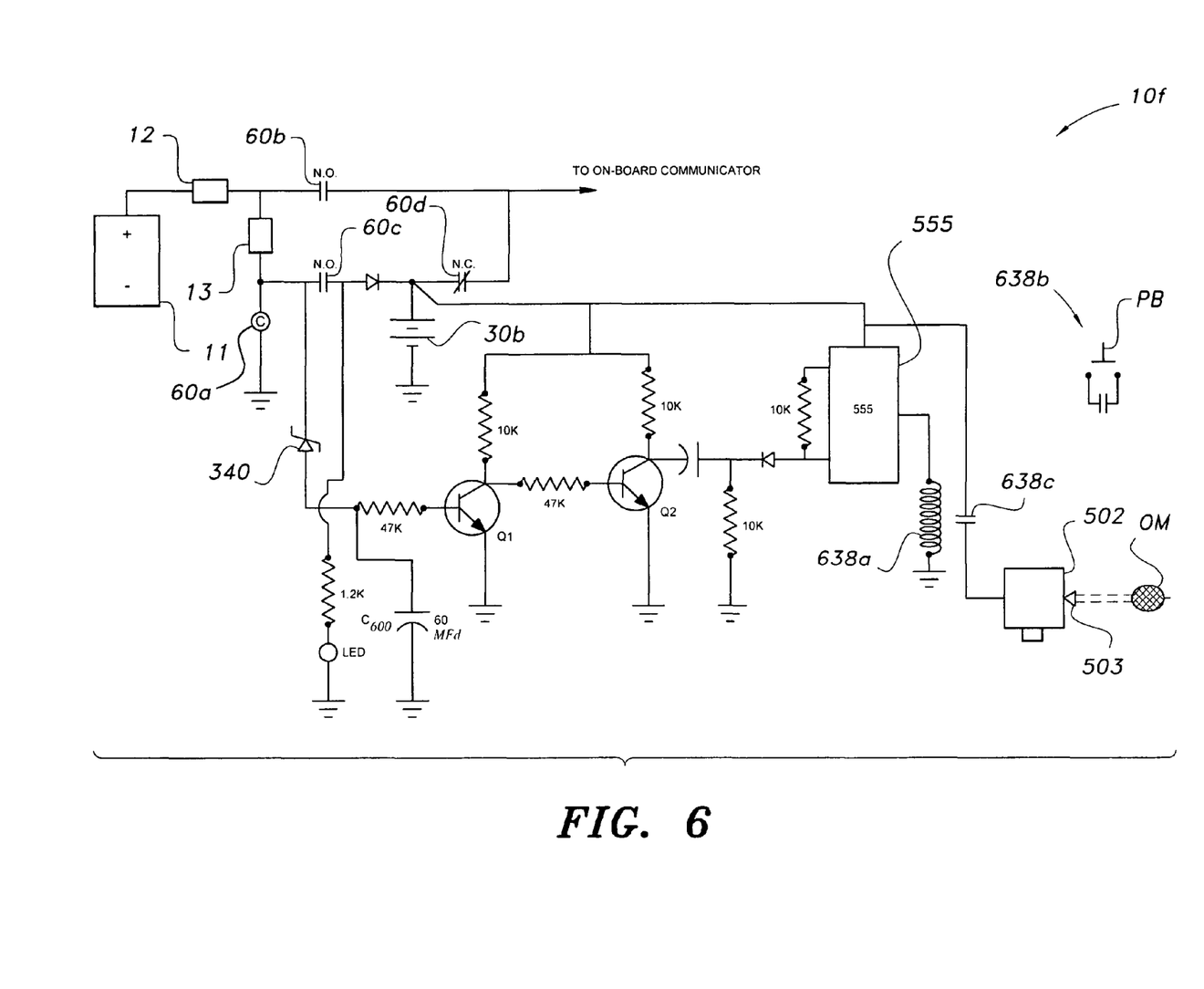
FIG. 6 is a block diagram of a battery backup for vehicle emergency communicator according to the present invention, featuring a pair of diodes and a pair of transistors for switching, a zener diode for voltage regulation, an integrated circuit solid-state timer for dialer activation, and a relay for telematics activation.

As most clearly shown in FIG. 6, emergency power system 10f includes a backup battery 30b and a tape recorder 502 for recording DTMF tones and voice message to accomplish automated dialing using the on-board emergency communicator. Connection to the main battery 11 is protected by fuse 12. Connection to the coil 60a of a first relay (a triple pole, single-throw relay having coil 60a, normally open contacts 60b and 60c, and normally closed contacts 60d) is protected by a 5-amp fuse 13. The timer circuit 555 has been drawn in FIG. 6 without reference to specific pinouts. For pinout detail of timer circuit 555, refer to FIG. 5.

When the main battery 11 is fully functional at a nominal 12 volts, the zener diode 340 conducts current to place approximately between 1 and 2 volts on base of transistor Q1 that keeps transistor Q2 from triggering the IC timer 555. The relay coil 60a is energized, closing normally open contacts 60b and 60c and opening normally contacts 60d to provide main battery power to the on-board communicator, as well as supplying charging current to backup battery 30b. Additionally, lamp LED illuminates when the main battery 11 is working properly.

When the main battery 11 is no longer functional, i.e., below the nominal 12 volts, no voltage will pass through zener diode 340. Therefore, the collector of transistor Q1 will go high, thereby causing transistor Q2 to conduct, causing the collector of transistor Q2 to drop, initiating a negative pulse to trigger integrated circuit timer 555, which turns on the relay coil 638a of a second relay (a double-pole, single-throw relay having coil 638a and normally open contacts 638b and 638c) for a time of approximately 20 seconds. The normally open contacts 638b close, shorting the contacts of push button PB, thereby keying the vehicle emergency communicator pushbutton PB. The normally open contacts 638c also close, applying power to the tape recorder 502, thereby activating the tape recorder 502, which, being already in play mode, plays a pre-recorded DTMF sequence and voice message dialing and notifying the emergency dispatcher through the speaker 503, which is in close proximity to the emergency communicator microphone OM. Normally open contacts 60b and 60c are open, while normally closed contacts 60d are closed, thereby switching backup battery 30b to supply power to the on-board communicator.

Figure 7:
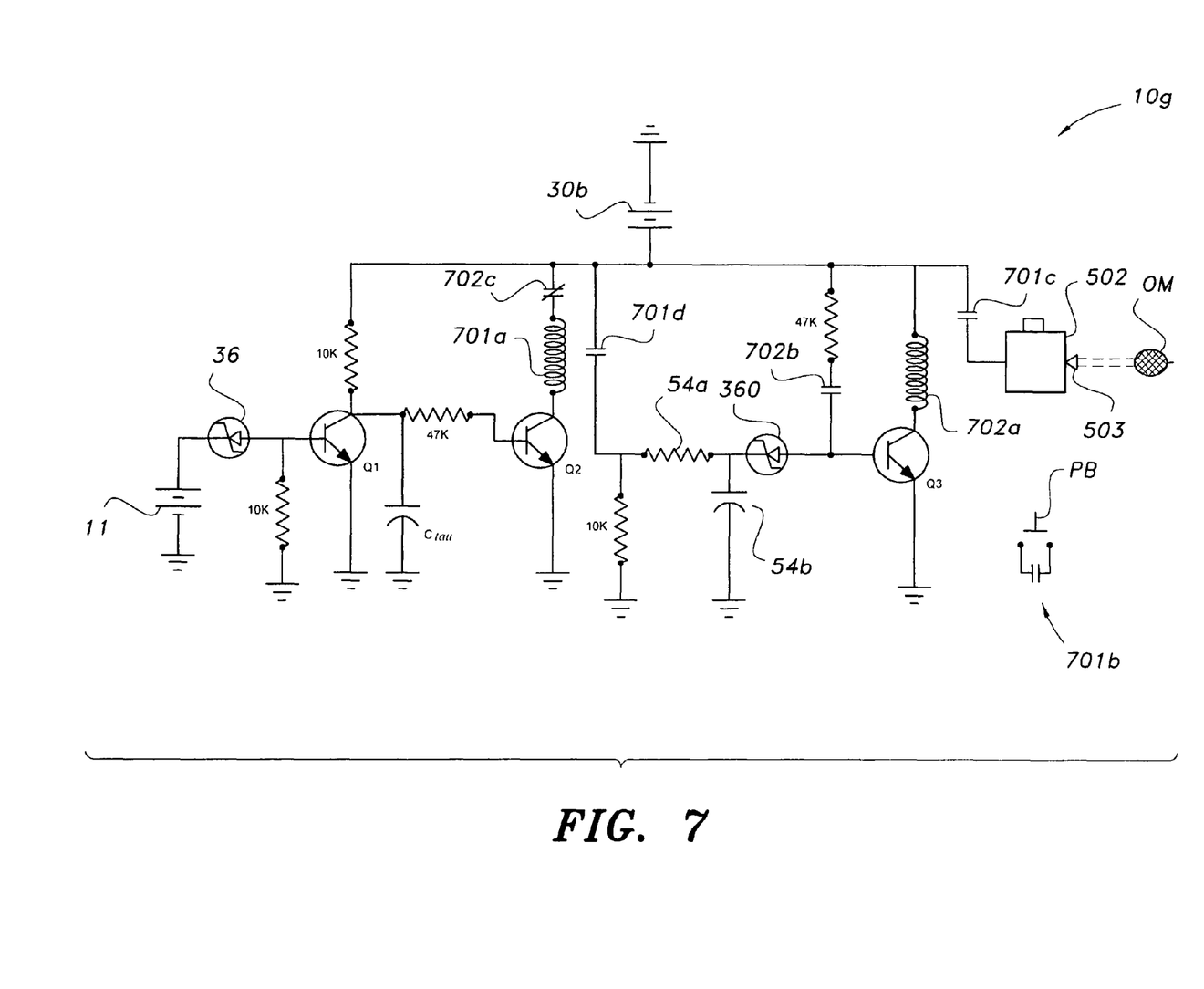
FIG. 7 is a block diagram of a battery backup for vehicle emergency communicator according to the present invention, featuring a pair of transistors for activation of a first relay keying the telematics, a zener diode for voltage regulation, and a discrete solid-state timer controlling a transistor actuated relay for dialer activation.

As most clearly shown in FIG. 7, emergency power system 10g includes a backup battery 30b and a tape recorder 502 for recording DTMF tones and voice message to accomplish automated dialing using the on-board emergency communicator.

If the main battery 11 is low, switching action of zener diode 36 causes the collector of transistor Q1 to go high, thereby switching transistor Q2, which causes relay coil 701a of a first relay (a triple-pole, single-throw relay having coil 701a and normally open contacts 701b, 701c, and 701d) to be energized, closing normally open contacts 701b, shorting push button PB, which keys the on-board emergency communicator pushbutton, and closing normally open contacts 701c to apply power to tape recorder 502. The tape recorder 502 then plays the DTMF tones and other pre-recorded information via speaker 503, which is in close proximity to emergency communicator microphone OM. Also, when relay coil 701a is energized, normally open contacts 701d are closed, applying power to an RC timing circuit comprising resistor 54a and capacitor 54b. When the voltage reaches the 8-volt breakdown voltage of zener diode 360, the relay coil 702a of a second relay (a double-pole, single-throw relay having relay coil 702a, normally open contacts 702b, and normally closed contacts 702c) is energized, opening normally closed contacts 702c, which de-energizes relay coil 701a to stop the tape player 502 and un-key the on-board emergency communicator pushbutton PB. Preferably the timing of RC circuit 54a and 54b is such that, after 30 seconds, all circuitry of system 10g is reset to its original state. Note that in FIGS. 4, 5, and 7 capacitor $C_{tau}$ is disposed between Q1 and ground. In FIG. 6, capacitor $C_{600}$ is disposed between anode of zener diode 340 and ground. The two configurations of capacitors $C_{tau}$ and $C_{600}$ add time delay to the battery backup circuitry to prevent actuating the system dialer 502 during starting of the vehicle.

Figure 8:
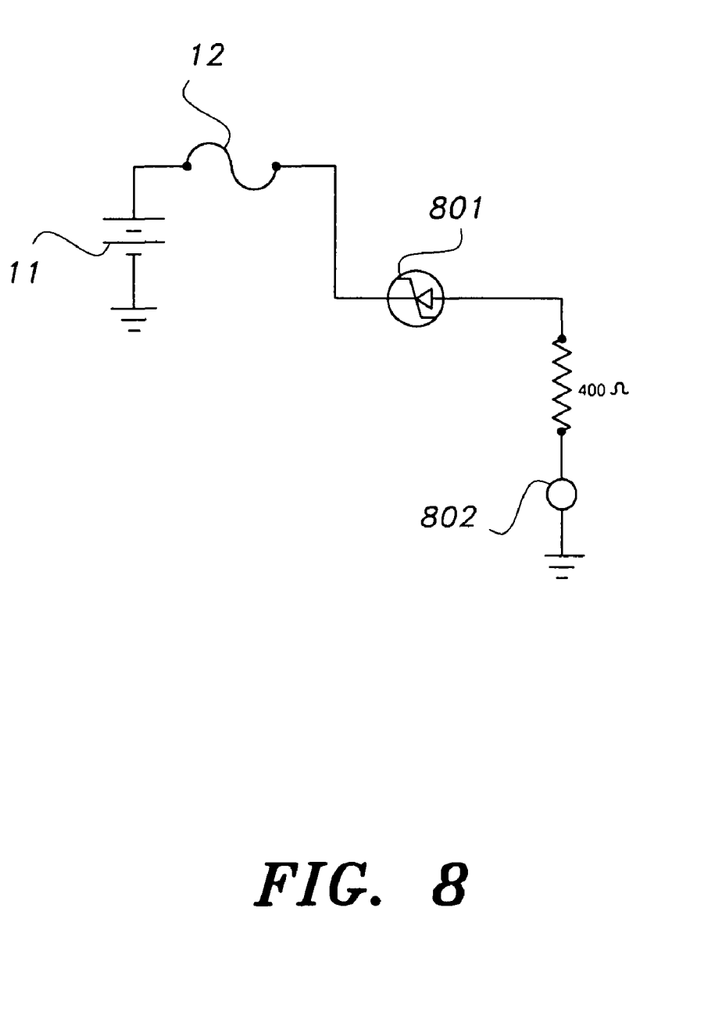
FIG. 8 is a block diagram of a circuit facilitating manual operation of a battery backup for vehicle emergency communicator according to the present invention.

For manual operation, the circuits discussed above would be adequate. The person arriving at the car would use the alternate battery to power the system to call whomever. As shown in FIG. 8, an LED light 802 is added to indicate the condition of the main battery 11. If the voltage is under 10 volts, the LED 802 will not light, since the zener diode 801 will not conduct. If the voltage is over 10 volts, the LED 802 will light.

It is to be understood that the present invention is not limited to the embodiments described above, but encompasses any and all embodiments within the scope of the following claims.

We claim:

1. A battery backup for a vehicle emergency communicator, comprising:

a backup battery;

at least one diode adapted for connection between a main vehicle battery and the backup battery, the at least one diode allowing the backup battery to be charged when the main vehicle battery is operational, the at least one diode isolating power from the backup battery when the main vehicle battery is non-operational, the backup battery selectively being the only source of power connected to the vehicle emergency communicator; and a charging relay adapted for being energized by the main vehicle battery, the charging relay having electrical contacts connecting said backup battery to power the vehicle emergency communicator when the charging relay is no longer energized due to failure of the main vehicle battery.

2. The battery backup for vehicle emergency communicator according to claim 1, wherein said backup battery is always connected to the vehicle emergency communicator.

3. The battery backup for vehicle emergency communicator according to claim 1, further comprising a fuse disposed between the main vehicle battery and said charging relay, the fuse protecting said charging relay when said charging relay is energized by the main vehicle battery.

4. A battery backup for vehicle emergency communicator Comprising:

a backup battery;

at least one diode adapted for connection between a main vehicle battery and the backup battery, the at least one diode allowing the backup battery to be charged when the main vehicle battery is operational, the at least one diode isolating power from the backup battery when the main vehicle battery is non-operational, the backup battery selectively being the only source of power connected to the vehicle emergency communicator;

a voice annunciator connected to said backup battery, the voice annunciator being actuated to send a message via the vehicle emergency communicator when the main vehicle battery is non-operational;

a timing relay, the timing relay selectively actuating said voice annunciator and the vehicle emergency communicator; and timing circuitry connected to said timing relay, the timing circuitry limiting duration of timing relay activation of said voice annunciator and the vehicle emergency communicator.

5. The battery backup for vehicle emergency communicator according to claim 4, wherein said voice annunciator further comprises a phone dialing mechanism actuable to communicate the message to a predetermined recipient.

6. The battery backup for vehicle emergency communicator according to claim 4, further comprising an LED lamp adapted for being operably connected to the main vehicle battery, the LED lamp illuminating when the main vehicle battery is working properly.

7. The battery backup for vehicle emergency communicator according to claim 4, wherein said timing circuitry comprises discrete transistor components.

8. The battery backup for vehicle emergency communicator according to claim 4, wherein said timing circuitry comprises of an integrated circuit.

9. A battery backup for a vehicle emergency communicator, comprising:

first, second and third transistor switching circuits, the first transistor switching circuit being connected to the second transistor switching circuit, the first transistor switching circuit being adapted for connection to a main battery of the vehicle, the first transistor switching circuit controlling the second transistor switching circuit responsive to a voltage level of the main battery;

an RC timing circuit interconnecting the second transistor switching circuit and the third transistor switching circuit;

a playback device having dialing instructions and voice information stored therein, the playback device including a speaker, the speaker being adapted for placement in close proximity to a microphone of the vehicle emergency communicator;

a first relay connected to the second transistor switching circuit, the second transistor switching circuit being configured for energizing the first relay when power from the main battery is lost, the first relay having contacts activating the playback device when the first relay is energized, and also activating a pushbutton of the vehicle emergency communicator, the dialing and voice instructions being transmitted to the microphone of the vehicle emergency communicator through the speaker; and a second relay connected to the third transistor switching circuit, the third transistor switching circuit being configured for energizing the second relay after a time delay determined by the RC timing circuit, the second relay de-energizing the first relay after elapse of the time delay, thereby turning off the playback device and deactivating the pushbutton of the vehicle emergency communicator.

* * * * *